United States Patent
Aikawa et al.

(10) Patent No.: US 10,830,367 B2
(45) Date of Patent: Nov. 10, 2020

(54) FLUID CONTROL SYSTEM

(71) Applicant: FUJIKIN INCORPORATED, Osaka (JP)

(72) Inventors: Kenji Aikawa, Osaka (JP); Tsutomu Shinohara, Osaka (JP); Hajime Nakagawa, Osaka (JP); Takahiro Matsuda, Osaka (JP); Akihiro Harada, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 49 days.

(21) Appl. No.: 16/312,015

(22) PCT Filed: Jun. 19, 2017

(86) PCT No.: PCT/JP2017/022537
§ 371 (c)(1),
(2) Date: Dec. 20, 2018

(87) PCT Pub. No.: WO2017/221893
PCT Pub. Date: Dec. 28, 2017

(65) Prior Publication Data
US 2019/0195378 A1    Jun. 27, 2019

(30) Foreign Application Priority Data

Jun. 21, 2016  (JP) ................................ 2016-123007

(51) Int. Cl.
*F16K 27/00* (2006.01)
*F17D 3/01* (2006.01)
*H01L 21/67* (2006.01)

(52) U.S. Cl.
CPC ............. *F16K 27/003* (2013.01); *F17D 3/01* (2013.01); *H01L 21/67017* (2013.01)

(58) Field of Classification Search
USPC ....................................................... 137/884
See application file for complete search history.

(56) References Cited

U.S. PATENT DOCUMENTS

| 4,615,298 A * | 10/1986 | Yamazaki | H01L 29/161 |
| | | | 118/50.1 |
| 8,720,478 B2 * | 5/2014 | Taskar | F16K 35/06 |
| | | | 137/383 |

(Continued)

FOREIGN PATENT DOCUMENTS

| JP | 2002-206700 A | 7/2002 |
| JP | 2003-97752 A | 4/2003 |

(Continued)

OTHER PUBLICATIONS

U.S. Appl. No. 16/312,060 to Kenji Aikawa et al., filed Dec. 20, 2018.

(Continued)

*Primary Examiner* — John Fox
(74) *Attorney, Agent, or Firm* — Greenblum & Bernstein, P.L.C.

(57) ABSTRACT

A fluid flow path of a joining block includes a vertical flow path and a horizontal flow path. The joining block is constrained on a rail member so as to be capable of moving in a longitudinal direction. A fluid control device is supported by the rail member via the joining block and includes a screw hole, and a tightening bolt that has passed through a body of the fluid control device is screwed into the screw hole. A gasket between the joining block and the body is compressed between the body and the joining block by a tightening force of the tightening bolt. The screw hole includes the tip portion closed above the horizontal flow path and at least partially overlaps the horizontal flow path in a planar view.

13 Claims, 26 Drawing Sheets

(56) References Cited

U.S. PATENT DOCUMENTS

2002/0031417 A1    3/2002  Hoshi et al.
2010/0132819 A1    6/2010  Nakata et al.

FOREIGN PATENT DOCUMENTS

JP    2015-175502 A    10/2015
WO    2008/146780 A1   12/2008

OTHER PUBLICATIONS

International Search issued in International Bureau of WIPO Patent Application No. PCT/JP2017/022537, dated Sep. 5, 2017.

* cited by examiner

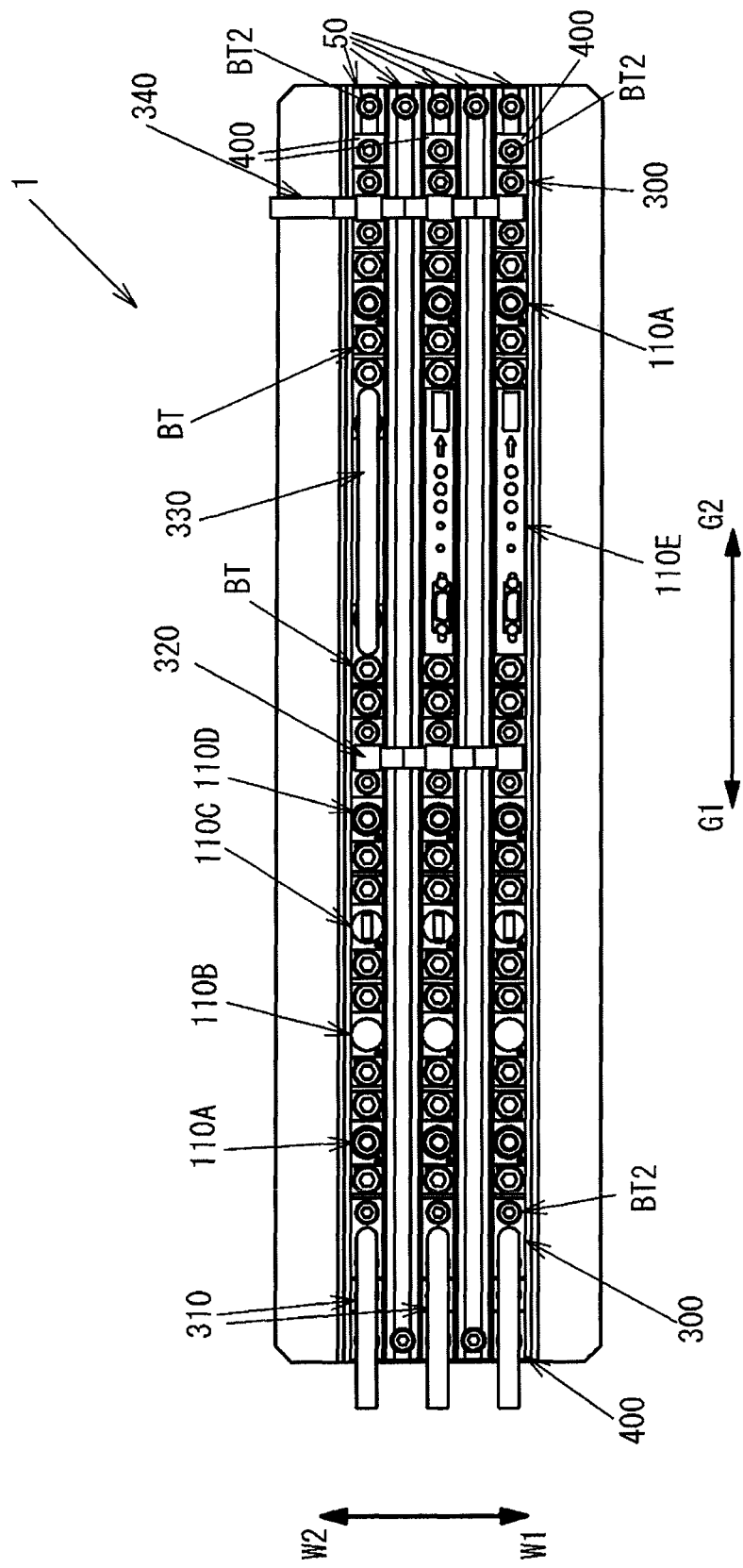

[Fig. 2A]
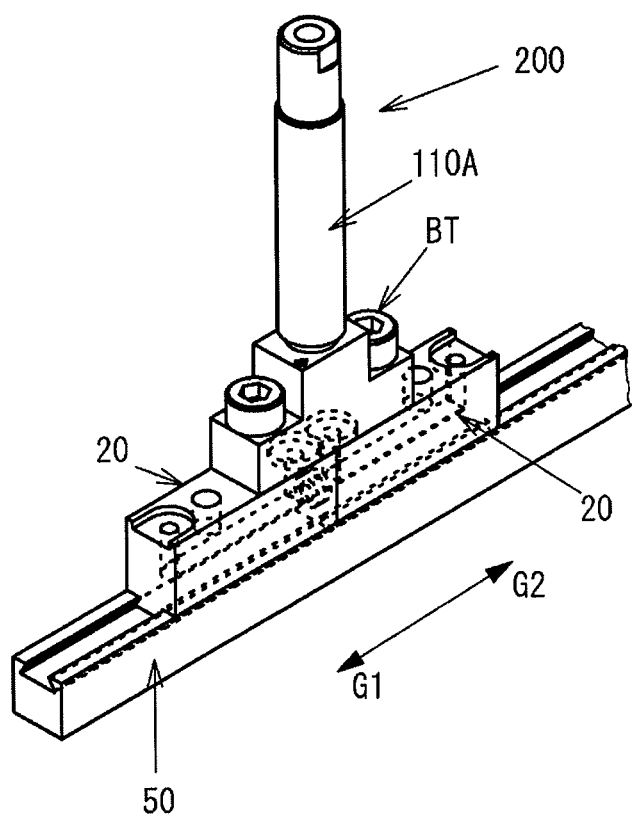

[Fig. 2B]
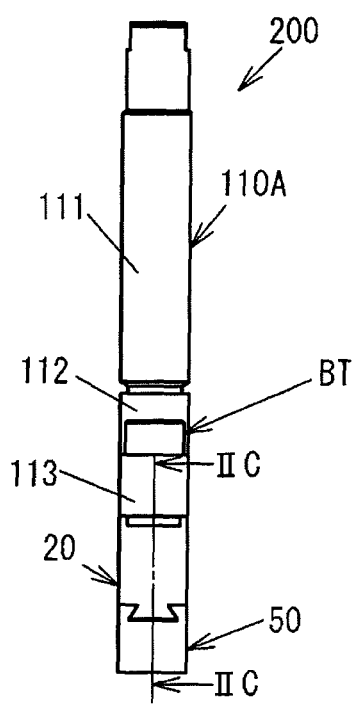

[Fig. 2C]
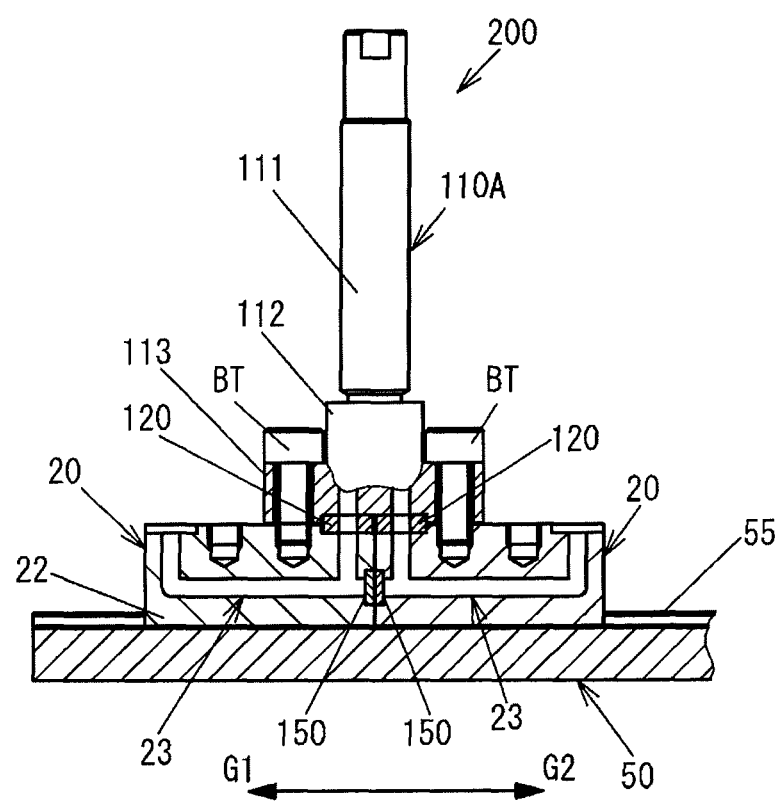

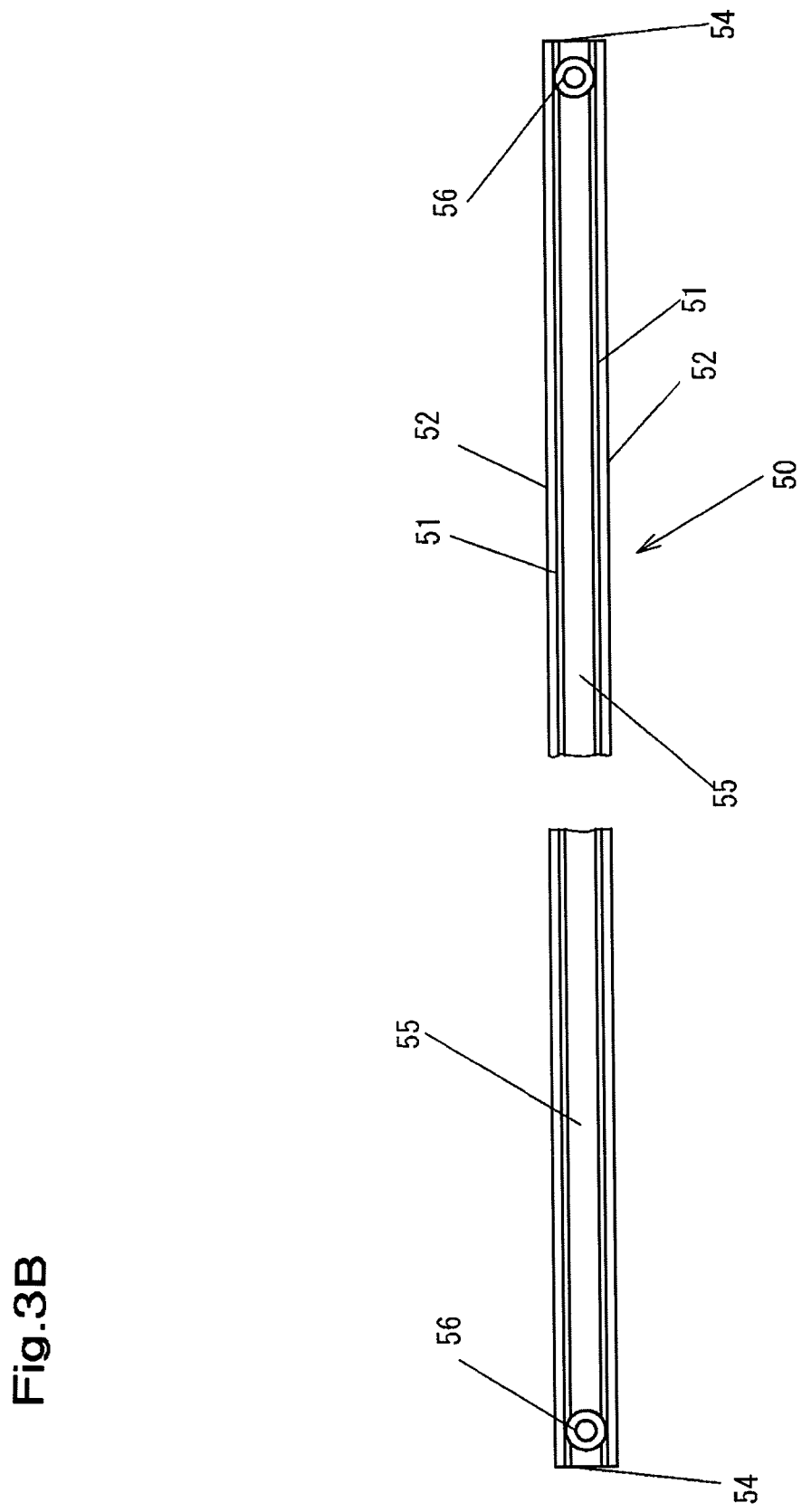

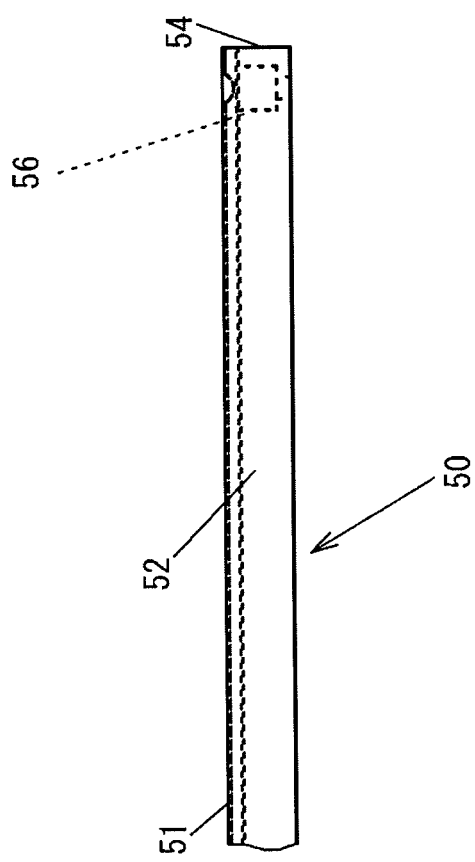
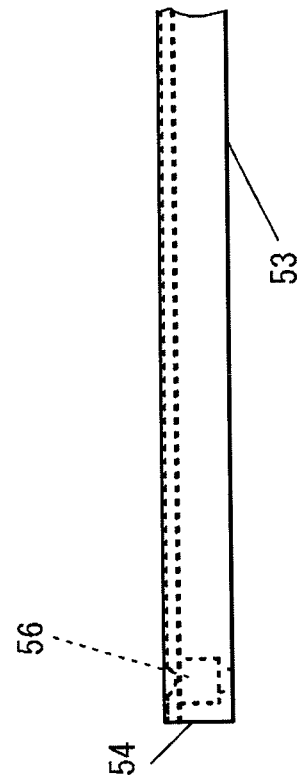
Fig.3C

[Fig. 3D]
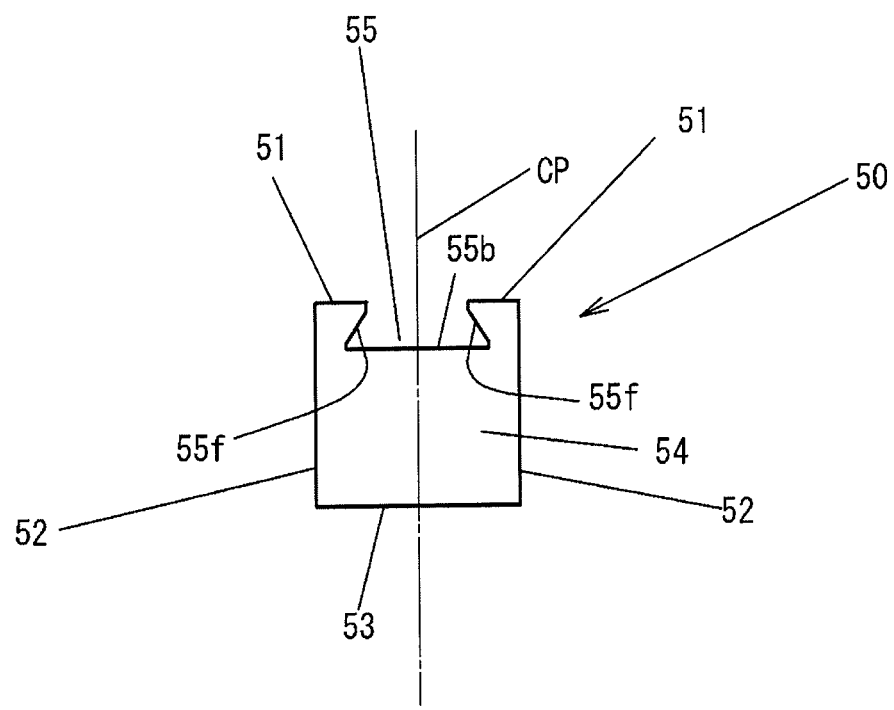

[Fig. 4A]
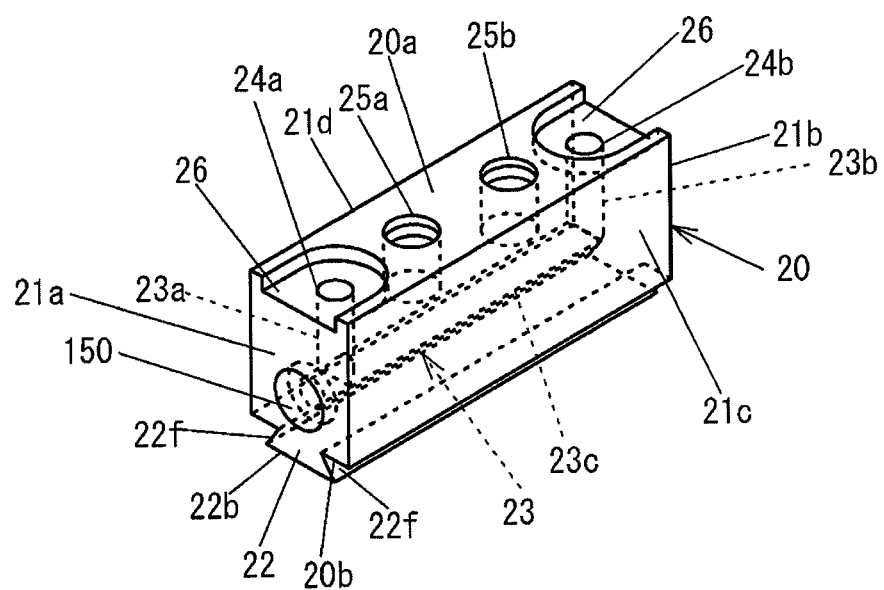

[Fig. 4B]
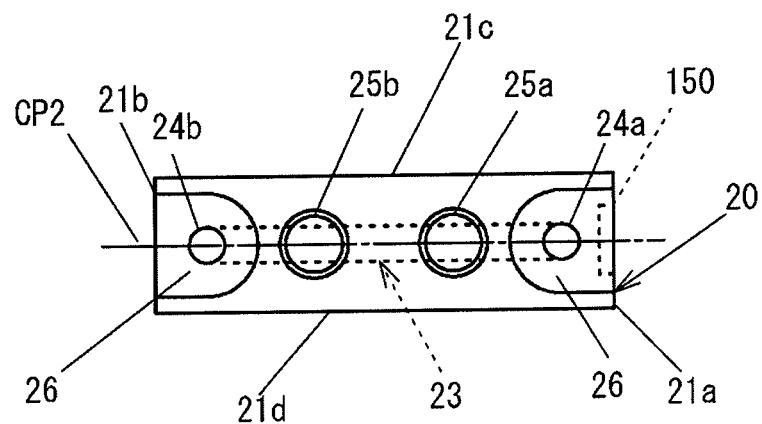
[Fig. 4C]
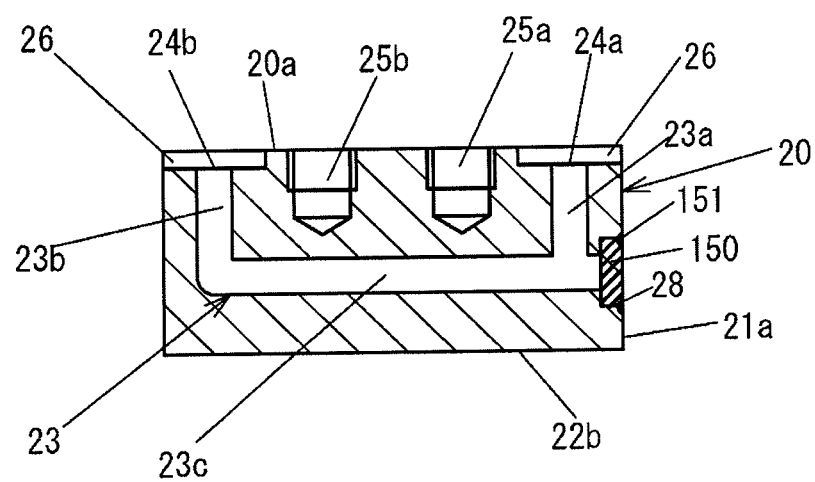

[Fig. 4D]
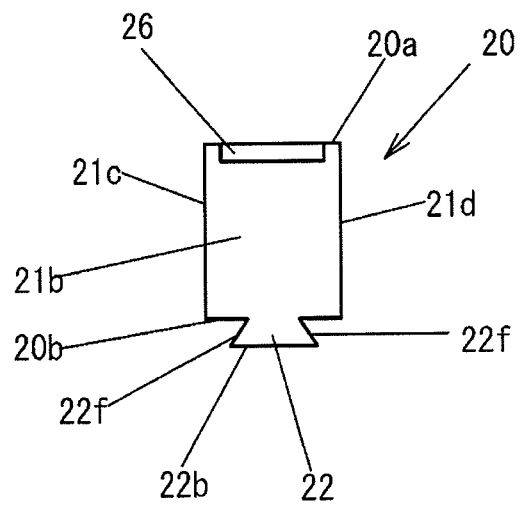
[Fig. 4E]
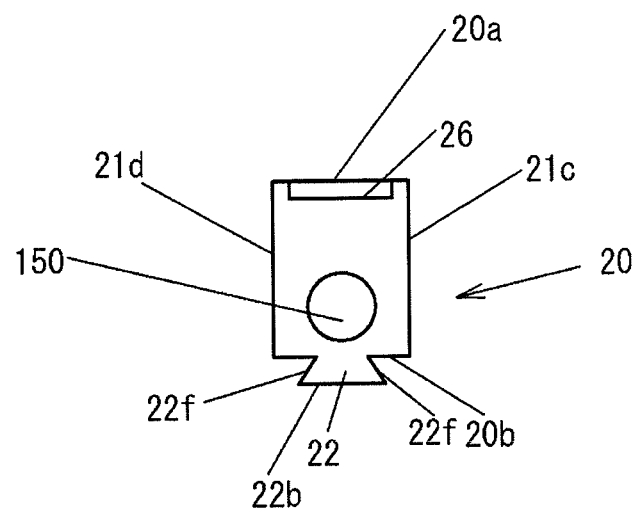

[Fig. 5A]
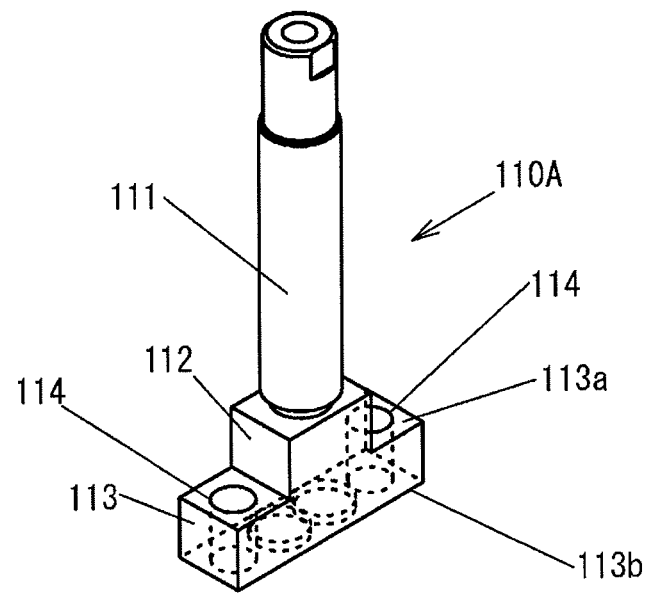
[Fig. 5B]
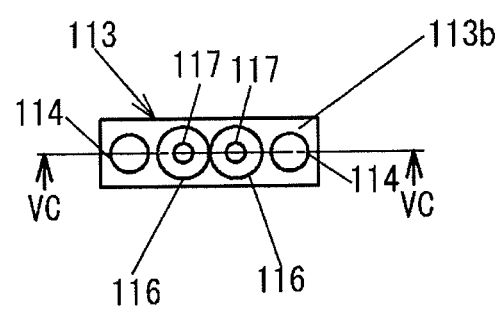

[Fig. 5C]
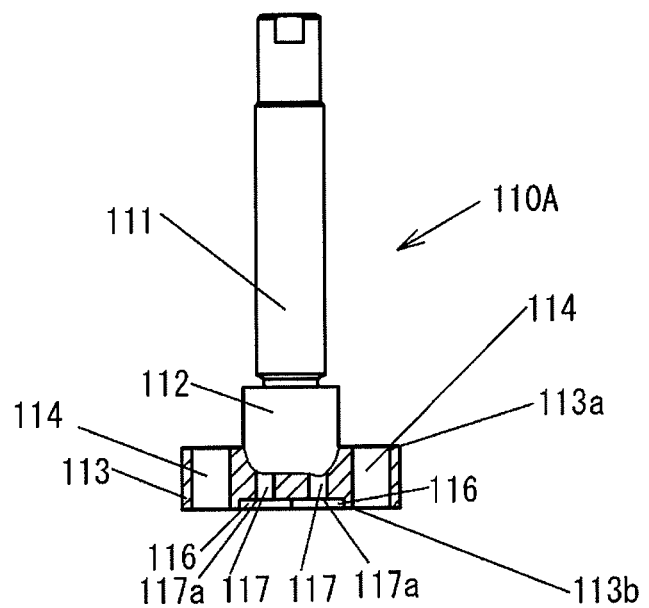

[Fig. 6A]
[Fig. 6B]
[Fig. 6C]

[Fig. 7A]
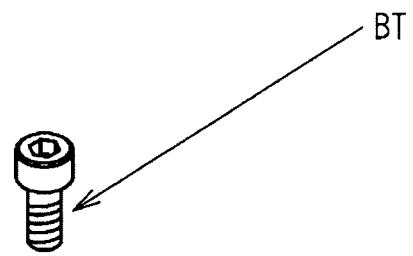
[Fig. 7B]
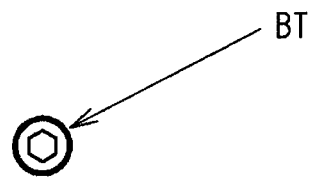

[Fig. 8A]
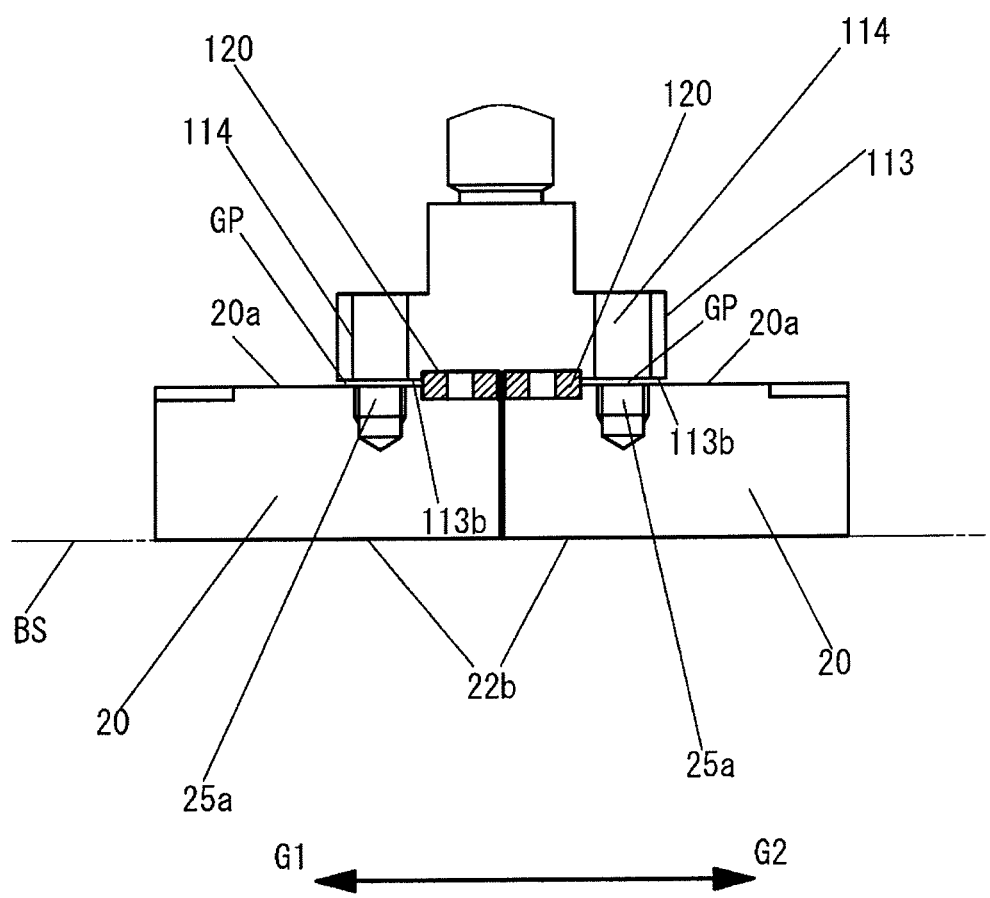

[Fig. 8B]
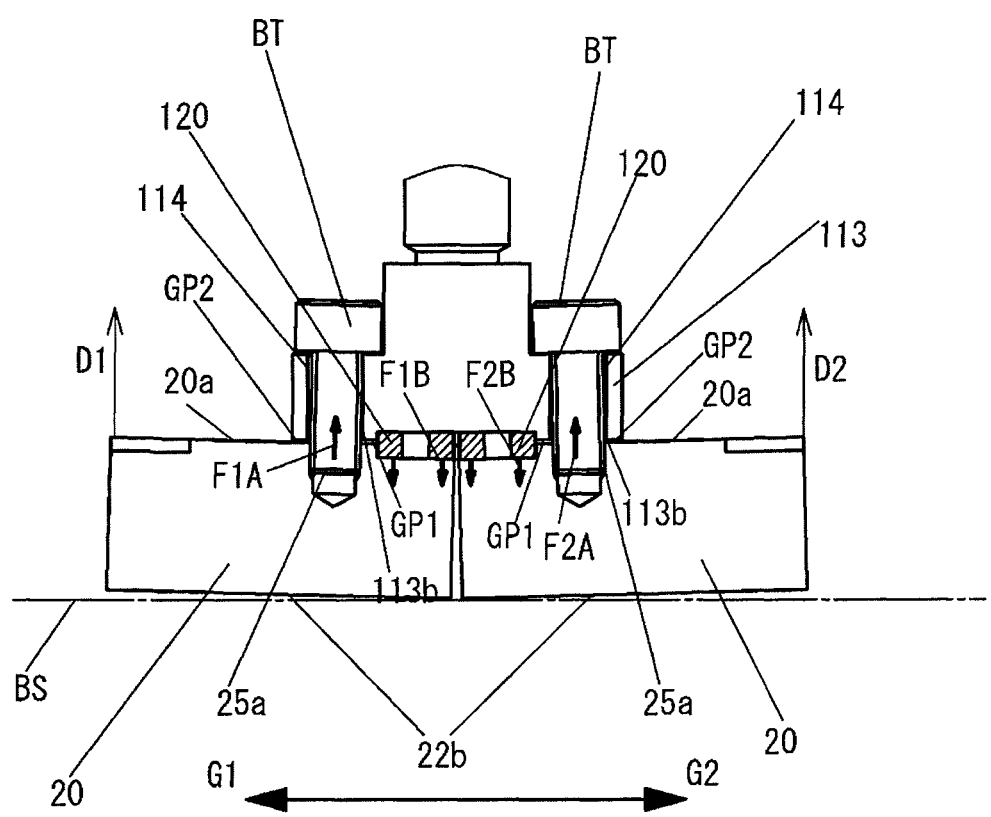

[Fig. 8C]
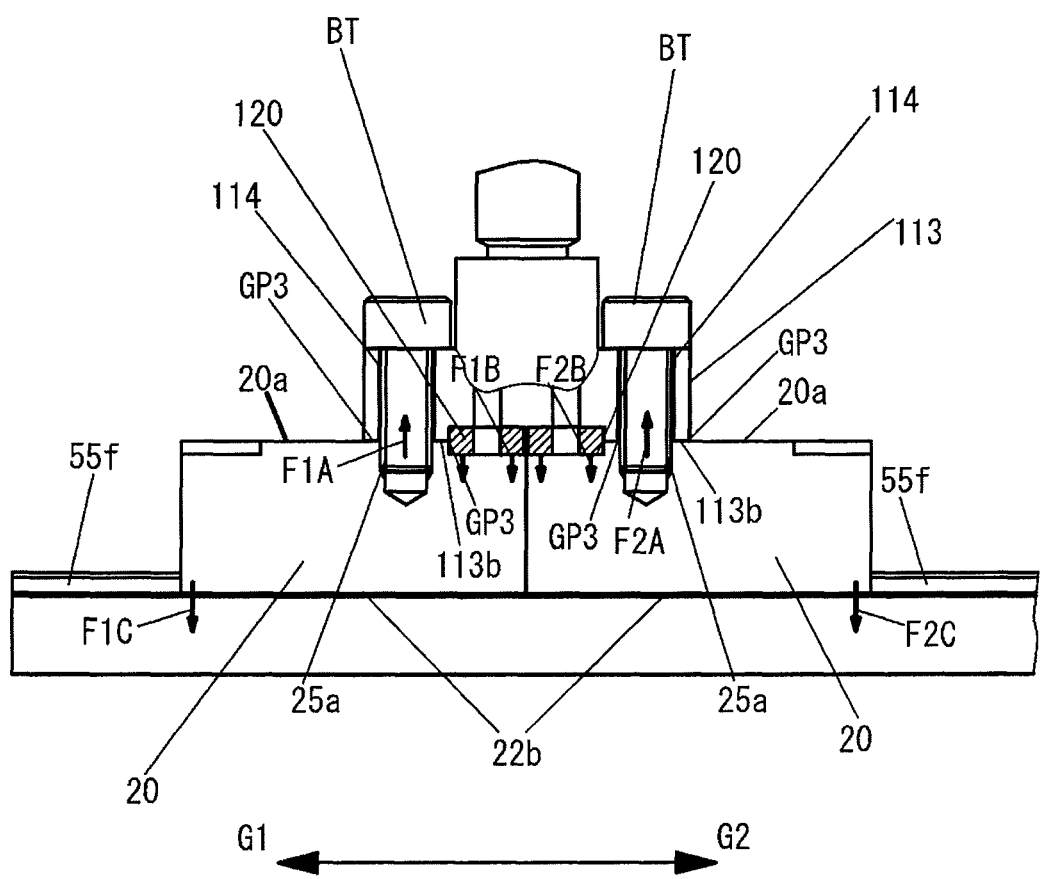

[Fig. 9A]
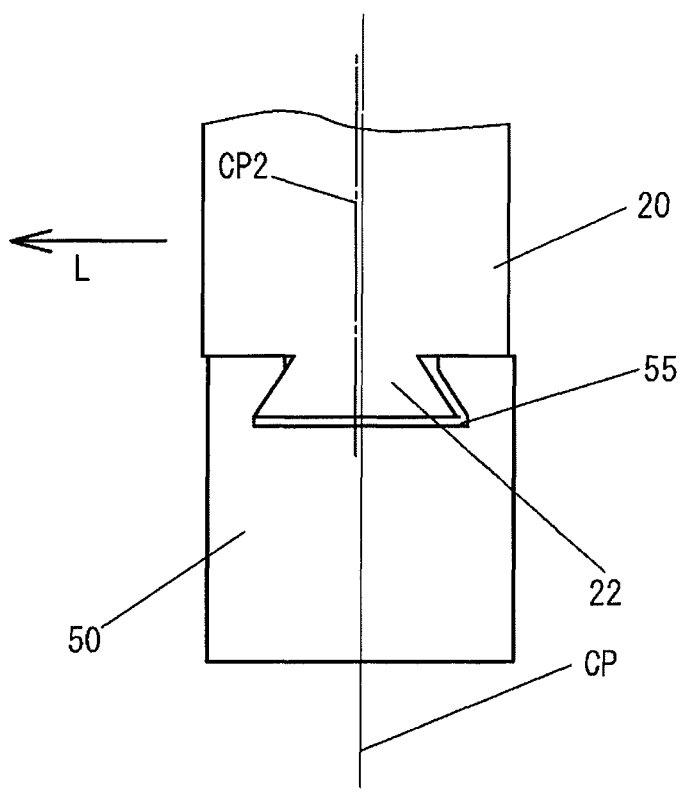

[Fig. 9B]
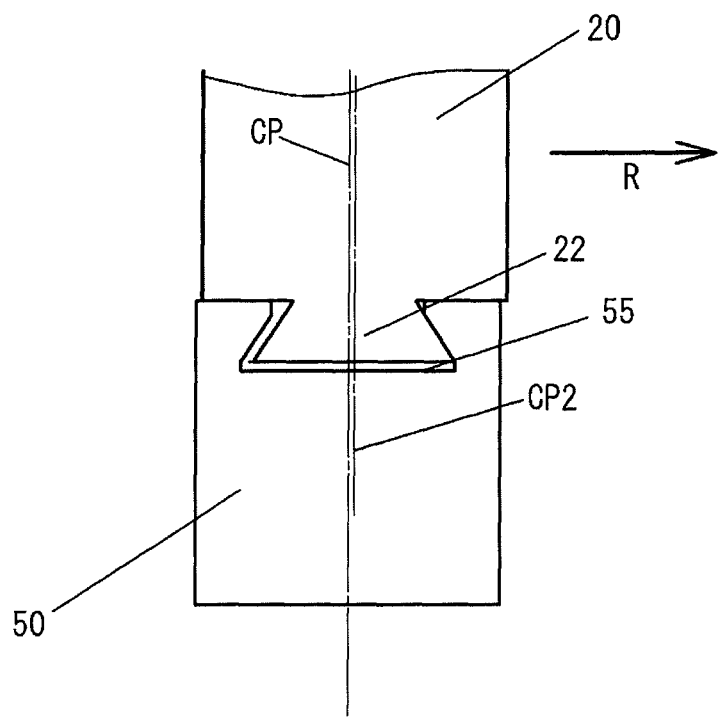

[Fig. 10]
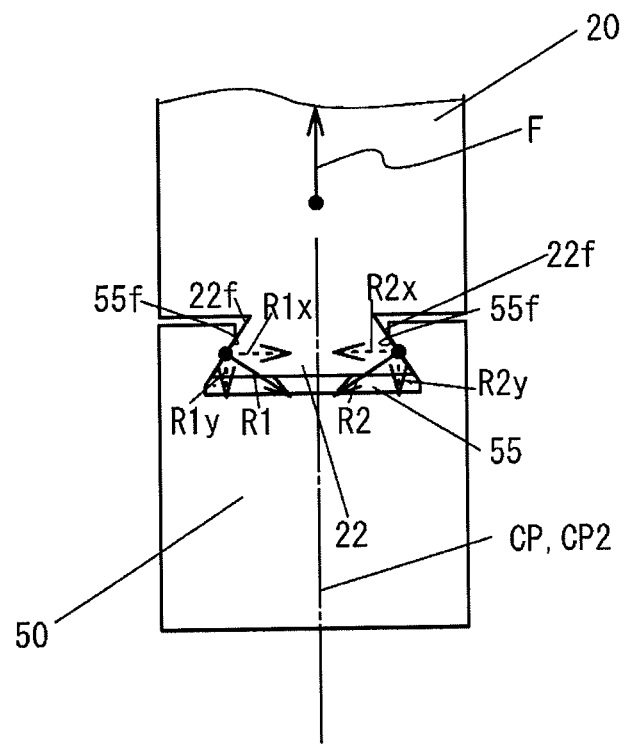
[Fig. 11A]
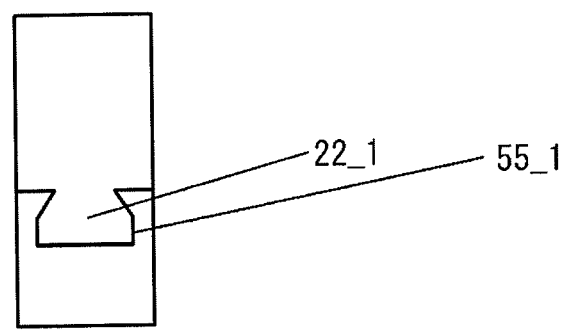

[Fig. 11B]
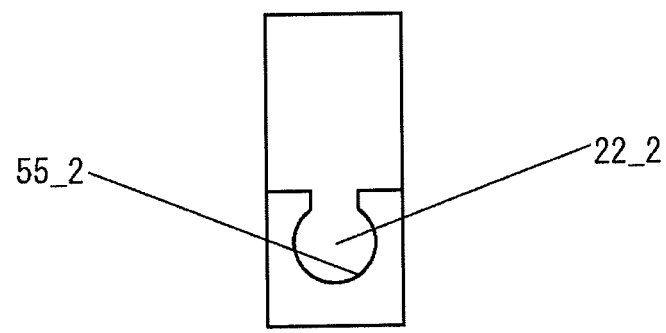
[Fig. 11C]
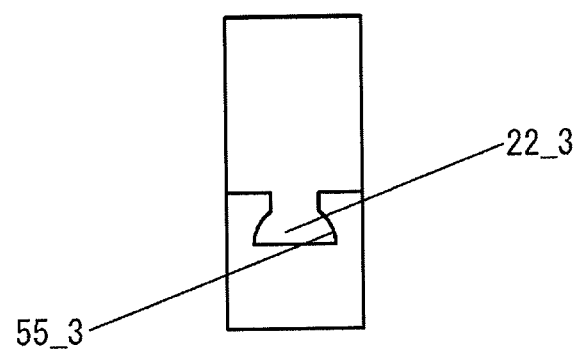

[Fig. 12A]
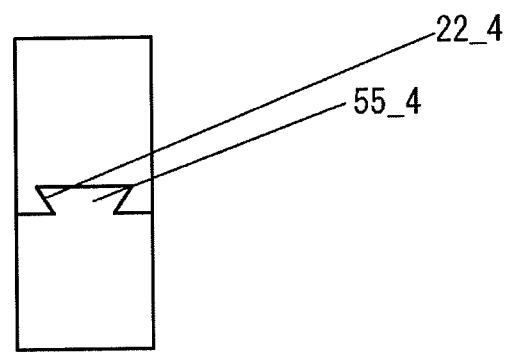

[Fig. 12B]
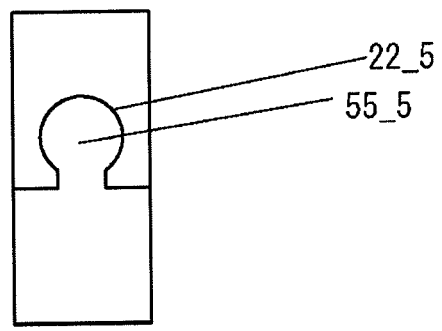

FLUID CONTROL SYSTEM

FIELD OF THE INVENTION

The present invention relates to a fluid control system with a fluid device integrated therein, a joining block used therefor, a fluid device, and a method for manufacturing a semiconductor device or the like using the fluid control system.

DESCRIPTION OF THE BACKGROUND ART

As a fluid control system used to supply various types of process gases to a chamber of a semiconductor manufacturing system or the like, there have been known, for example, the systems disclosed in Patent Documents 1 and 2 below, and the like.

PATENT DOCUMENTS

Patent Document 1: Japanese Laid-Open Patent Application No. 2002-206700
Patent Document 2: Japanese Laid-Open Patent Application No. 2015-175502

SUMMARY OF THE INVENTION

Problems to be Solved by the Invention

In the field of such a fluid control system described above, higher responsiveness is required to control the supply of the process gases. To this end, the fluid control system needs to be made more compact and integrated to the extent possible to install the system closer to the chamber that is the supply destination of the fluid.

Further, the objects to be processed have been increasing in size, such as the increase in size of the diameter of the semiconductor wafer, making it necessary to also increase a supply flow rate of the fluid supplied from the fluid control system into the chamber accordingly.

When the fluid control system is simply made more compact, the cross-sectional area of the fluid flow path also decreases, and the supply flow rate is also reduced.

Furthermore, as the fluid control system is made more compact and integrated, assembly becomes difficult and the assembly man-hours increase. In addition, the maintainability of the system also deteriorates.

An object of the present invention is to provide a fluid control system which, without reducing the supply flow rate of a fluid, is considerably more compact and integrated.

Another object of the present invention is to provide a fluid control system that achieves greatly reduced assembly man-hours, and has improved maintenance performance as well.

Means for Solving the Problems

A fluid control system of the present invention comprises:
a joining block defining a top surface and a bottom surface facing each other, and side surfaces extending from the top surface toward the bottom surface, defining a fluid flow path, and comprising an engaging part on the bottom surface;
a support member comprising a guide part that extends linearly in a longitudinal direction and is engageable with the engaging part of the joining block; and
a fluid device supported by the support member via the joining block, wherein:

the fluid flow path of the joining block comprises a first flow path extending from the top surface toward the bottom surface and provided with a flow path port that opens at the top surface, and a second flow path extending linearly through an interior of the joining block in the longitudinal direction and connected with the first flow path;
the guide part constrains the joining block on the support member while allowing the joining block to move in the longitudinal direction;
the fluid device comprises a body defining the fluid flow path and provided with at least two flow path ports that open on a bottom surface thereof;
the joining block comprises a screw hole that opens at the top surface, extends toward the bottom surface, and is for screwing a tightening bolt that has passed through the body;
the tightening bolt produces a tightening force that presses a sealing member between the body and the joining block, the sealing member being disposed around the flow path port of the joining block and one of the flow path ports of the body, that face each other; and
the screw hole comprises a tip portion closed above the second flow path, and at least partially overlaps the second flow path in a planar view.

A joining block of the present invention is a joining block defining a top surface and a bottom surface facing each other, and side surfaces extending from the top surface toward the bottom surface side, and defining a fluid flow path, the joining block comprising:
an engaging part engageable with another member on the bottom surface; and
two screw holes, each connectable with another member and formed from the top surface toward the bottom surface, wherein:
the fluid flow path of the joining block comprises two first flow paths, each extending from the top surface toward the bottom surface and provided with a flow path port that opens at the top surface, and a second flow path extending linearly through an interior of the joining block in the longitudinal direction and connected with the two first flow paths, in positions separated from each other in a longitudinal direction; and
the two screw holes are disposed between the two flow path ports in the longitudinal direction, the screw holes each comprising a tip portion closed above the second flow path and each at least partially overlapping the second flow path in a planar view.

A fluid device of the present invention is a fluid device comprising at least one of a switch valve, a regulator, a pressure gauge, and a mass flow controller, the fluid device comprising:
a body defining a fluid flow path and provided with at least two flow path ports that open on a bottom surface thereof; and
a joining block defining a top surface and a bottom surface facing each other, and side surfaces extending from the top surface toward the bottom surface, and defining a fluid flow path, wherein:
the fluid flow path of the joining block comprises a first flow path extending from the top surface toward the bottom surface and provided with a flow path port that opens at the top surface, and a second flow path extending linearly through an interior of the joining block in the longitudinal direction and connected with the first flow path, in positions separated from each other in a longitudinal direction;
the joining block comprises an engaging part engageable with another member on the bottom surface, and a screw hole that opens on the top surface side, extends toward the bottom surface, and is for screwing a tightening bolt that has passed through the body;

the tightening bolt produces a tightening force that compresses a sealing member between the body and the joining block, the sealing member being disposed around the flow path port of the joining block and one of the flow path ports of the body, that face each other; and the screw hole comprises a tip portion closed above the second flow path, and at least partially overlaps the second flow path in a planar view.

Effect of the Invention

According to the present invention, the engaging part of the joining block is engaged with the guide part of the support member and thus constrained on the support member, eliminating the need for connecting work using a bolt between the joining block and the support member and making it possible to greatly reduce assembly man-hours. Further, a plurality of the fluid devices are connected by individual and independent joining blocks, and the bottom surface of the joining block is not fixed to the support member, making fluid flow path changes easy and significantly improving maintainability as well.

According to the present invention, the screw hole for screwing the tightening bolt to be formed in the joining block is disposed not on four sides or both sides of the sealing member, but rather only on one side of the sealing member, making it possible to greatly reduce the number of tightening bolts and an occupied area.

According to the present invention, the screw hole to be formed in the joining block is disposed in a position that overlaps a horizontal flow path in the planar view, making it possible to further reduce the occupied area of the tightening bolt and, in particular, greatly narrow the width of the joining block.

According to the present invention, the arrangement of the horizontal flow path of the joining block is biased to the bottom surface, making it possible to maintain the flow path cross-sectional area and to avoid reducing of the supply flow rate of the fluid.

According to the present invention, when the fluid device or the joining block fails, only the failed fluid device or joining block needs to be replaced, greatly improving maintainability.

According to the present invention, the fluid control system can be made greatly more compact and integrated as a whole, making it possible to bring the fluid control system as close as possible to the vicinity of the processing chamber and, as a result, increase the responsiveness of fluid control.

BRIEF DESCRIPTION OF THE DRAWINGS

FIG. 1B is a plan view of the fluid control system in FIG. 1A.

FIG. 2A is an external perspective view of a partial assembly extracted from the fluid control system in FIG. 1A.

FIG. 2B is a side view of the assembly in FIG. 2A.

FIG. 2C is a partial cross-sectional view along line IIC-IIC in FIG. 2B.

FIG. 3B is a plan view of the rail member in FIG. 3A.

FIG. 3C is a front view of the rail member in FIG. 3A.

FIG. 3D is a side view of the rail member in FIG. 3A.

FIG. 4A is an external perspective view of a joining block.

FIG. 4B is a plan view of the joining block in FIG. 4A.

FIG. 4C is a cross-sectional view along a virtual central plane CP2 in FIG. 4B.

FIG. 4D is a left side view of the joining block in FIG. 4B.

FIG. 4E is a right side view of the joining block in FIG. 4B.

FIG. 5A is a perspective view of a switch valve.

FIG. 5B is a bottom view of a body of the switch valve in FIG. 5A.

FIG. 5C is a partial cross-sectional view of the body of the switch valve in FIG. 5A.

FIG. 6A is an external perspective view of a gasket.

FIG. 6B is a plan view of the gasket.

FIG. 6C is a cross-sectional view of the gasket.

FIG. 7A is a perspective view of a tightening bolt.

FIG. 7B is a plan view illustrating a head portion of the tightening bolt.

FIG. 8A is a schematic view of the assembly disposed on a reference surface without using the rail member, before tightening.

FIG. 8B is a schematic view illustrating the assembly in FIG. 8A tightened by the tightening bolts.

FIG. 8C is a schematic view illustrating the assembly tightened by the tightening bolts using the rail member.

FIG. 9A is a schematic view illustrating an example of displacement of the joining block that can occur before the tightening bolts are tightened.

FIG. 9B is a schematic view illustrating another example of the displacement of the joining block that can occur before the tightening bolts are tightened.

FIG. 10 is a schematic view for explaining an operation of an alignment mechanism resulting from tightening the tightening bolts.

FIG. 11A is a schematic view illustrating an example of a variation of an engaging part and a guide part.

FIG. 11B is a schematic view illustrating another example of a variation of the engaging part and the guide part.

FIG. 11C is a schematic view illustrating still another example of a variation of the engaging part and the guide part.

FIG. 12A is a schematic view illustrating still another example of a variation of the engaging part and the guide part.

FIG. 12B is a schematic view illustrating still another example of a variation of the engaging part and the guide part.

DESCRIPTION OF THE PREFERRED EMBODIMENTS

An embodiment of the present invention is described below with reference to the drawings.

In the following, a fluid control system according to an embodiment of the present invention is described in detail with reference to FIG. 1A to FIG. 10.

Figure 1A:
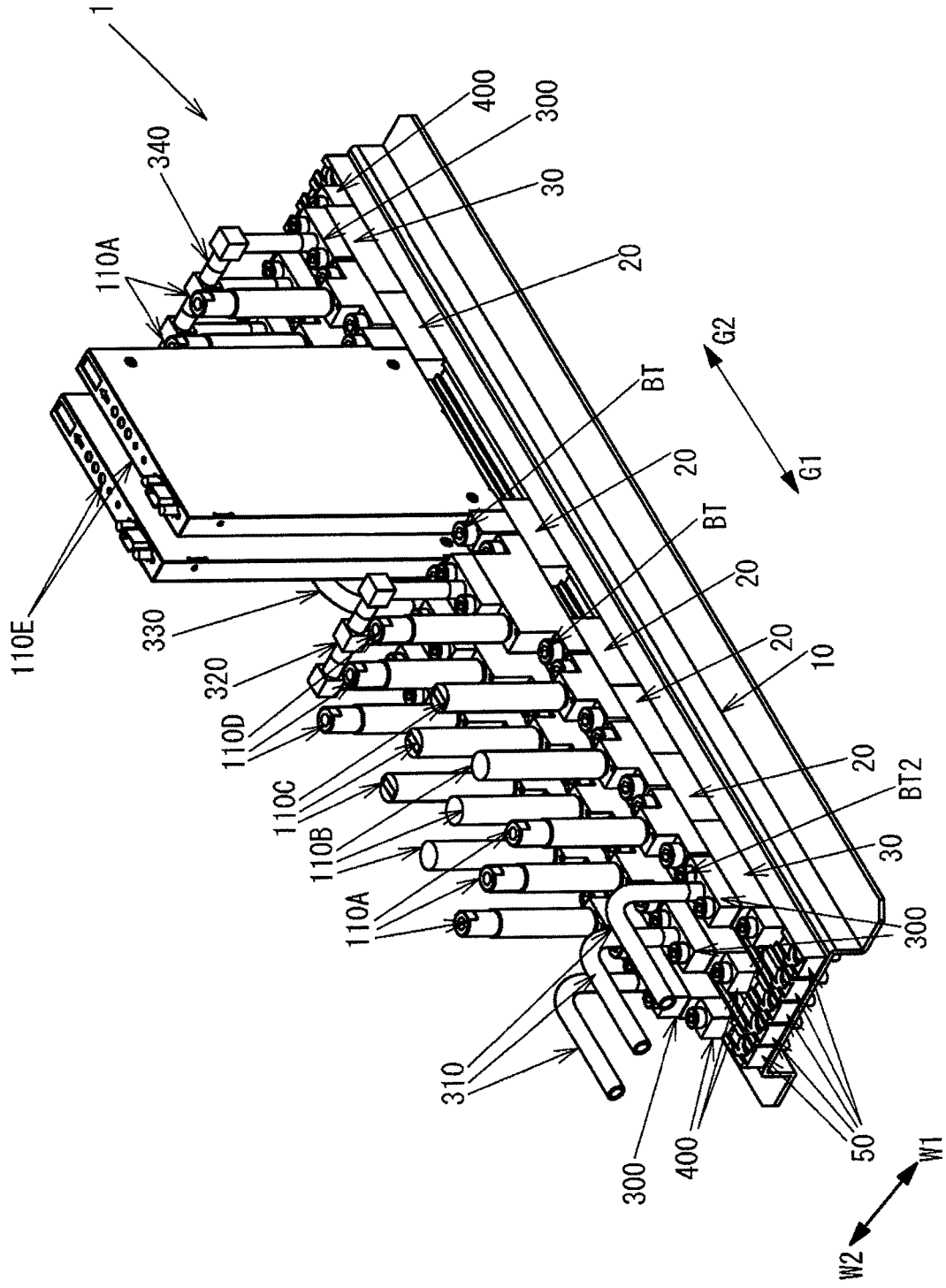
FIG. 1A is an external perspective view of a fluid control system according to an embodiment of the present invention.
Figure 1C:
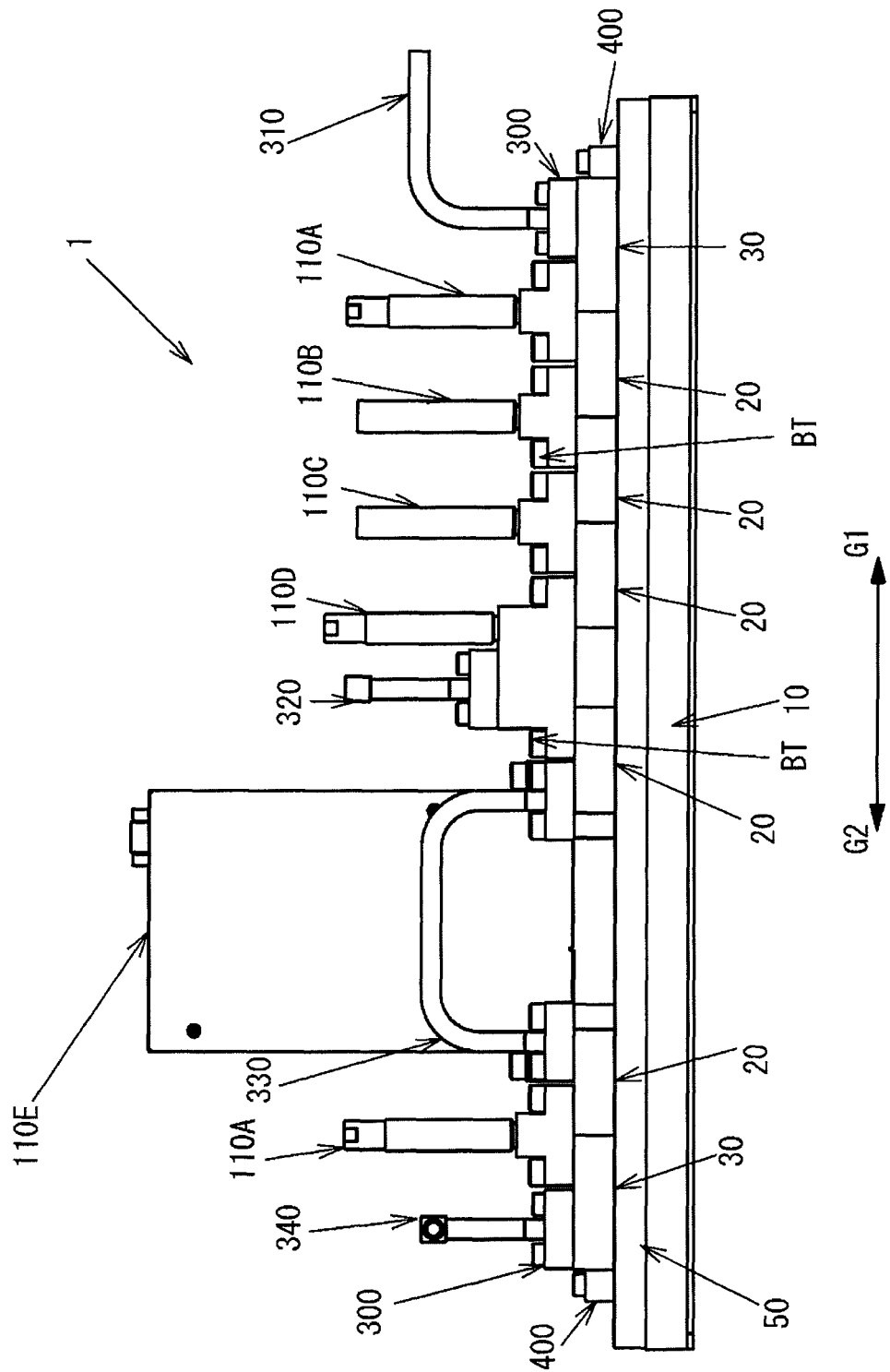
FIG. 1C is a rear view of the fluid control system in FIG. 1A.

As illustrated in FIG. 1A to FIG. 1C, in a fluid control system 1, five rail members 50 arranged in width directions W1, W2 and extending in longitudinal directions G1, G2 are provided on a base plate 10 made of metal. It should be noted that W1, W2, G1, and G2 denote a front side, a rear side, an upstream side, and a downstream side, respectively. Various members are installed on, among the five rail members 50, the rail members 50 in both end portions and a central portion, only. Members are not installed on the second and fourth rail members 50. With these second and fourth rail members 50 being empty, various members can be added thereto. When not needed, these two rail members 50 can be removed from the base plate 10, allowing the three rail members 50 in both end portions and the central portion to be arranged adjacent to one another.

In the present invention, the rail members 50 attached to the base plate 10 is not limited to a plurality and may be one. However, the greater the quantity, the more remarkable the effect of the present invention.

As illustrated in FIG. 1A, in the two rail members 50 disposed on the front side and in the central portion, various fluid devices 110A to 110E are installed via a plurality of joining blocks 20, 30, and a flow path through which a fluid flows from the upstream side toward the downstream side are formed by the plurality of joining blocks 20, 30. In the rail member 50 on the rear side, the fluid devices 110A to 110D, excluding the fluid device 110E, and a communicating tube 330 are installed via the plurality of joining blocks 20, 30, and thus a flow path through which the fluid flows from the upstream side toward the downstream side is formed.

Here, the fluid device of the present invention is a device used in a fluid control system for controlling a flow of a fluid, and comprises a body defining a fluid flow path and provided with at least two flow path ports that open at a bottom surface thereof. Specifically, the fluid device includes the switch valve (two-way valve) 110A, the regulator 110B, the pressure gauge 110C, the switch valve (three-way valve) 110D, the mass flow controller 110E, and the like, but is not limited thereto.

An introducing tube 310 is connected to the flow path port on the upstream side of the two flow path ports (not illustrated) formed in the joining block 30, by a joining member 300. A sealing member (not illustrated) is interposed between the joining member 300 and the joining block 30. Examples of the sealing member include a gasket made of a metal, a resin, or the like.

Examples of the gasket include a soft gasket, a semi-metal gasket, a metal gasket, and the like. Specifically, the gaskets below are preferably used.
(1) Soft Gasket
  Rubber O-ring
  Rubber sheet (for a flat face)
  Joint sheet
  Expanded graphite sheet
  Polytetrafluoroethylene (PTFE) sheet
  Polytetrafluoroethylene (PTFE) jacket type
(2) Semi-Metal Gasket
  Spiral-wound gasket
  Metal jacket gasket
(3) Metal Gasket
  Metal flat gasket
  Metal hollow O-ring
  Ring joint The gasket is pressed to provide a seal between the joining member 300 and the joining block 30 by tightening two tightening bolts BT2 from both sides of the gasket (not illustrated) described above. The configuration of the fluid flow path formed in the joining block 30 is the same as that in the joining block 20 described later, and thus a description thereof is omitted here. The flow path port on the downstream side (not illustrated) of the joining block 30 is connected with the switch valve 110A. The connecting structure of this section is the same as the connecting structure described later of the joining block 20 and the fluid devices 110A to 110E described later, and thus a detailed description thereof is omitted.

A process gas such as ammonia gas, a process gas such as hydrogen gas, and a purge gas such as nitrogen gas are respectively introduced to the flow paths of three routes of the fluid control system 1 through the introducing tube 310 on the front side, the introducing tube 310 in the central portion, and the introducing tube 310 on the rear side, for example.

The three switch valves (three-way valves) 110D are connected to one another by a communicating tube 320, and thus the purge gas can be introduced to the flow path of the process gas.

The communicating tube 330 is provided midway on the flow path in place of the mass flow controller 110E since the mass flow controller 110E is not required in the flow path route of the purge gas.

A supply tube 340 connects the three joining members 300 disposed on the downstream side, and is connected to a processing chamber (not illustrated).

Stoppers 400 are fixed to a bottom surface of a guide part 55 by the tightening bolts BT2 in the end portions on the upstream side and the downstream side of the front side, the central portion, and the rear side, and thus movement in the longitudinal directions G1, G2 of the fluid devices 110A to 110E connected to one another by each flow path route is regulated. The fixed positions of the stoppers 400 can be suitably changed and adjusted in accordance with the number of fluid devices and the like.

FIG. 2A to FIG. 2C are diagrams illustrating a partial assembly 200 constituting the flow path of one route of the fluid control system 1, FIG. 2A being a perspective view, FIG. 2B being a side view, and FIG. 2C being a cross-sectional view along line IIC-IIC in FIG. 2B.

The assembly 200 comprises the rail member 50, the upstream side and the downstream side joining blocks 20, 20 disposed on this rail member 50, and the switch valve 110A as a fluid device disposed on the upstream side and the downstream side joining blocks 20, 20. Further, gaskets 120, 120 are provided as sealing members between a body 113 of the switch valve 110A and the upstream side and the downstream side joining blocks 20, 20. Furthermore, the assembly 200 comprises two tightening bolts BT for connecting the body 113 of the switch valve 110A to the upstream side and the downstream side joining blocks 20, 20.

Figure 3A:
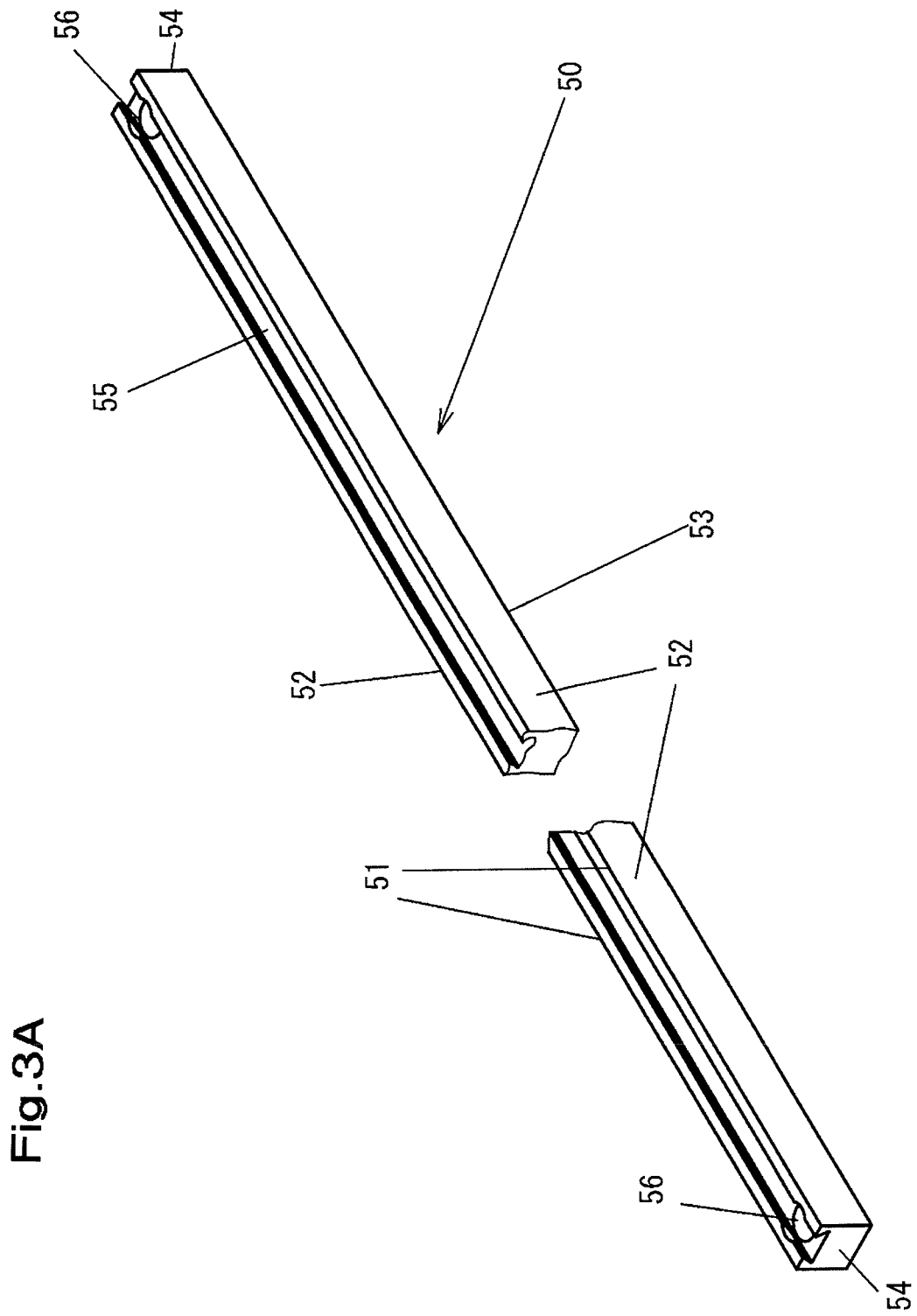
FIG. 3A is an external perspective view of a rail member.

FIG. 3A to FIG. 3D are diagrams illustrating the rail member 50, FIG. 3A being an external perspective view, FIG. 3B being a plan view, FIG. 3C being a front view, and FIG. 3D being a side view.

The rail member 50 is, for example, a long member made of a metal such as a stainless alloy, has a cross section formed into a rectangular shape, and defines a top surface 51, two side surfaces 52 orthogonal thereto, a bottom surface 53 parallel with the top surface 51 and orthogonal to the side surfaces 52, and both end surfaces 54 in the longitudinal direction. The guide part 55 formed into a groove shape in the longitudinal direction extends to the top surface 51. This guide part 55, as illustrated in FIG. 3D, is formed symmetrically with respect to a virtual central plane CP passing through a center position of the top surface 51 and the bottom surface 53 of the rail member 50 and extending in the longitudinal direction, and comprises a bottom surface 55*b* and two receiving surfaces 55*f* inclined into a fan shape toward the bottom surface 55*b*. The two receiving surfaces 55*f* are inclined in opposite directions. The receiving surfaces 55*f* are inclined at an angle of about 57 degrees with respect to the bottom surface 55b, but the angle is not limited thereto. The top surface 51 of the rail member 50 functions as a support surface capable of supporting the joining blocks 20, 30 and the stoppers 400. Through holes 56 for tightening bolts for fixing the rail member 50 to the base plate 10 are formed in both end portions of the bottom surface 55b of the guide part 55 in the longitudinal direction. The dimensions of the rail member 50 are about 10 mm in width and height, and a total length thereof is about 300 mm. The dimensions, however, are not limited thereto. The stoppers 400 can be fixed by the tightening bolts BT2 in any position of the guide part 55 in the longitudinal direction. The fixing structure adopted can be any known structure, and thus a detailed description thereof is omitted.

FIG. 4A to FIG. 4E are diagrams illustrating the joining block 20, FIG. 4A being an external perspective view, FIG. 4B being a plan view, FIG. 4C being a cross-sectional view along the virtual central plane CP2 in FIG. 4B, FIG. 4D being one end view in the longitudinal direction, and FIG. 4E being the other end view in the longitudinal direction.

The joining block 20 is a member made of a metal such as a stainless alloy, and comprises a top surface 20a and a bottom surface 20b, which are flat surfaces facing each other, and four side surfaces 21a, 21b, 21c, 21d, each orthogonal to the top surface 20a. Among the four side surfaces 21a, 21b, 21c, 21d, the two side surfaces adjacent to each other are orthogonal to each other. The side surfaces 21a, 21b are flat surfaces positioned at both ends in the longitudinal direction, and the side surfaces 21c, 21d are flat surfaces extending in the longitudinal direction. It should be noted that, while an example is given in which the joining block 20 has a rectangular parallelepiped shape, another shape may be adopted.

The bottom surface 20b functions as a supported surface supported by the top surface 51 of the rail member 50. An engaging part 22, however, is integrally formed on this bottom surface 20b so as to protrude. The engaging part 22 is formed in a fan shape from the bottom surface 20b downward, and comprises engaging surfaces 22f inclined in directions opposite each other. The engaging part 22 is formed symmetrically with respect to a virtual central plane CP2, and the inclined angle of the engaging surfaces 22f with respect to a bottom surface 22b is substantially the same as that of the receiving surfaces 55f of the rail member 50, but is not limited thereto. The engaging part 22 has a shape that fits together with the guide part 55 of the rail member 50, and is insertable from both end portions of the rail member 50 in the longitudinal direction. The guide part 55 constrains the joining block 20 on the rail member 50 while allowing the engaging part 22 to move in the longitudinal direction. While play within a set tolerance range exists between the engaging part 22 and the guide part 55 from the perspective of machining and assembly, this play is set within a range in which an alignment mechanism described later reliably operates.

A fluid flow path 23 defined by the joining block 20 includes a first vertical flow path 23a extending from the top surface 20a toward the bottom surface 20b and provided with a flow path port 24a that opens at the top surface 20a; a second vertical flow path 23b extending from the top surface 20a toward the bottom surface 20b and provided with a flow path port 24b that opens at the top surface 20a, in positions separated from each other in a longitudinal direction; and a horizontal flow path 23c extending linearly through an interior of the joining block 20 in the longitudinal direction and connected with the first and the second vertical flow paths 23a, 23b. It should be noted that, while the first and the second vertical flow paths 23a, 23b are formed vertically with respect to the top surface 20a, and the horizontal flow path 23c is formed in parallel with the top surface 20a, the arrangement is not limited thereto, and the flow paths may be set as neither vertical nor horizontal.

The first and the second vertical flow paths 23a, 23b may be machined by, for example, making a hole with a drill on the top surface 20a of the joining block 20 in the vertical direction to form a blind hole. The horizontal flow path 23c may be machined by making a hole with a drill on the side surface 21a of the joining block 20 in the vertical direction to form a blind hole. At this time, the horizontal flow path 23c is machined at a height connected with the tip portions of the first and the second vertical flow paths 23a, 23b. When the hole for forming the horizontal flow path 23c is opened from the side surface 21a of the joining block 20, an opening is formed on the side surface 21a. Thus, a holding recessed part 28 is formed around the opening of the side surface 21a, a closing member 150 having a disc shape and made of a metal is fit into this holding recessed part 28, and an outer periphery edge portion of the closing member 150 is sealed by welding, thereby closing the opening. As a result, a U-shaped flow path comprising the first and the second vertical flow paths 23a, 23b and the horizontal flow path 23c is formed.

Holding recessed parts 26, 26 for respectively holding the gaskets 120 are formed around the flow path ports 24a, 24b that open on the top surface 20a side of the joining block 20. A protrusion (not illustrated) having a circular shape and subjected to a hardening treatment to achieve a hardness sufficiently higher than that of the gasket 120 in order to crush the gasket 120 may be formed on the outer periphery of the flow path ports 24a, 24b on the bottom surfaces of the holding recessed parts 26, 26.

Two screw holes 25a, 25b that open at the top surface 20a and extend toward the bottom surface 20b are formed in the longitudinal direction in the joining block 20. The screw holes 25a, 25b are positioned between the two flow path ports 24a, 24b that open at the top surface 20a. The screw holes 25a, 25b are, for example, size M5, comprise at least three threads, and have a depth of about 3 mm, but are not limited thereto. Further, while central axes thereof are positioned on the virtual central plane CP2, the positioning is not limited thereto, and the screw holes 25a, 25b may be shifted one way in the width direction, or one of the screw holes 25a, 25b may be disposed on the side surface 21c side while the other may be disposed on the side surface 21d side. Furthermore, the dimensional specifications of the joining block 20 are, for example, a width of about 10 mm, a length of about 30 mm, a diameter of the fluid flow path 23 of about 2.6 mm, and a height of about 13 mm, but are not limited thereto. The widths of the joining block 20 and the rail member 50 are about 10 mm, substantially matching.

The screw hole 25a is positioned above the horizontal flow path 23c, and the screw hole 25a and the horizontal flow path 23c overlap in the planar view illustrated in FIG. 4B. Furthermore, the screw hole 25a is on the side surface 21b side rather than on the side surface 21a side, with respect to the flow path port 24a, and is formed only on one side with respect to the flow path port 24a in the longitudinal direction of the joining block 20. With such a configuration, a cross-sectional area of the fluid flow path 23 can be maintained, the gasket 120 that seals the periphery of the flow path port 24a can be crushed by the tightening force of the one tightening bolt BT, and the joining block 20 and the body 113 of the switch valve 110A can be connected. As a result, the width of the joining block 20 can be greatly narrowed. Similarly, the screw hole 25b is positioned above the horizontal flow path 23c, and the screw hole 25b and the horizontal flow path 23c overlap in the planar view illustrated in FIG. 4B. Furthermore, the screw hole 25b is on the side surface 21a side rather than on the side surface 21b side, with respect to the flow path port 24b, and is formed only on one side with respect to the flow path port 24b. With such a configuration, the cross-sectional area of the fluid flow path 23 can be maintained, the gasket 120 that seals the periphery of the flow path port 24b can be crushed by the one tightening bolt BT, and the joining block 20 and the body 113 of another fluid device can be connected.

Furthermore, as is clear from FIG. 4C and FIG. 4E, the horizontal flow path 23c is biased toward the bottom surface 20b between the top surface 20a and the bottom surface 20b. Adopting such a configuration makes it possible to adequately maintain the depth of the screw holes 25a, 25b in which the tightening bolts BT are screwed.

FIG. 5A to FIG. 5C are diagrams illustrating the switch valve (fluid device) 110A, FIG. 5A being a perspective view, FIG. 5B being a bottom view, and FIG. 5C being a partial cross-sectional view in the direction of line VC-VC in FIG. 5B.

The switch valve 110A comprises an actuator incorporating part 111, a valve incorporating part 112, and the body 113, and is supported by the rail member 50 via the joining block 20.

The width of the body 113 matches the width of the joining block 20, and is, for example, about 10 mm. However, the width is not limited thereto.

The body 113 defines a fluid flow path 117. This fluid flow path 117 comprises two flow path ports 117a that open on a bottom surface 113b, and holding recessed parts 116 for respectively holding the gaskets 120 are formed in the two flow path port 117a. A protrusion (not illustrated) having a circular shape and subjected to a hardening treatment to achieve a hardness sufficiently higher than that of the gasket 120 in order to crush the gasket 120 may be formed in the holding recessed part 116.

Through holes 114 for inserting the tightening bolts BT therethrough may be formed from a top surface 113a toward the bottom surface 113b in both end portions of the body 113 in the longitudinal direction.

FIG. 6A to FIG. 6C are a perspective view, a plan view, and a cross-sectional view of the gasket 120.

The gasket can be formed using the same material as that of the body 113 made of a stainless alloy or the like, but needs to be thermally treated so that the hardness is sufficiently lower than that of the body 113. Other than a metal material, a gasket made of a resin may also be used.

FIG. 7A and FIG. 7B are a perspective view of the tightening bolt BT and a plan view of the head portion. The tightening bolt BT connects the body 113 and the joining block 20, and has a diameter (M5, for example) greater than that (M4, for example) of the tightening bolt BT2 used in other locations in order to singly bear the force for crushing the gasket 120, but all tightening bolts may be a common size.

Here, the role of the rail member 50 and the alignment mechanism of the present invention will be described.

In the embodiment described above, the alignment mechanism includes the two receiving surfaces 55f of the guide part 55 of the rail member 50, and two engaging surfaces 22f of the engaging part 22 of the joining block 20.

FIG. 8A illustrates the two joining blocks 20, 20 placed on a reference surface BS rather than on the rail member 50, the gaskets 120 disposed in predetermined locations, and the body 113 of the switch valve 110A as the fluid device placed thereon.

In this state, the gaskets 120 are not pressed, and thus a substantially uniform gap GP is formed between the bottom surface 113b of the body 113 and the top surface 20a of the two joining blocks 20.

Next, as illustrated in FIG. 8B, when the tightening bolts BT are inserted through the through holes 114 of the body 113, screwed into the screw holes 25a, 25a of the upstream side and the downstream side joining blocks 20, 20, and tightened, a lifting force in the direction indicated by arrows F1A, F2A in the screw holes 25a, 25a and a downward force indicated by arrows F1B, F2B from the gaskets 120, 120 act on the upstream side and the downstream side joining blocks 20, 20. Accordingly, an upstream side end portion of the upstream side joining block 20 rises in a direction D1 relative to the reference surface BS, and a downstream side end portion of the downstream side joining block 20 also rises in a direction D2 relative to the reference surface BS.

The gaskets are pressed by the tightening force of the tightening bolts BT, and thus a gap GP2 of a position separated from the gasket 120 is smaller than the gap GP in FIG. 8A, and smaller than a gap GP1 in the vicinity of the gasket 120. Thus, a bending force that causes the upstream side joining block 20 and the downstream side joining block 20 to incline in opposite directions acts on the body 113 and the upstream side and the downstream side joining blocks 20, 20 connected to each other.

As illustrated in FIG. 8C, when the engaging parts 22, 22 of the upstream side and the downstream side joining blocks 20, 20 are inserted into the guide part 55 of the rail member 50, and the tightening bolts BT are tightened in the same manner as in FIG. 8B, the upstream side and the downstream side joining blocks 20, 20 receive a reaction force in the downward direction indicated by arrows F1C, F2C from the receiving surfaces 55f of the guide part 55 of the rail member 50 resisting the bending force described above, and thus the upstream side and the downstream side joining blocks 20, 20 never incline. As the tightening bolts BT are tightened so as to reach a required axial force, a gap GP3 between the bottom surface 113b of the body 113 and the top surfaces 20a of the two joining blocks 20 becomes zero or substantially zero, and the bottom surface 113b of the body 113 and the top surfaces 20a of the two joining blocks 20 are brought substantially in contact.

Here, as described above, when slight play exists between the guide part 55 of the rail member 50 and the engaging parts 22, 22 of the upstream side and the downstream side joining blocks 20, 20 with the tightening bolts BT not tightened, the virtual central plane CP2 of the engaging part 22 may be displaced in a leftward direction L with respect to the virtual central plane CP of the guide part 55 of the rail member 50 as illustrated in FIG. 9A or in a rightward direction R as illustrated in FIG. 9B, for example.

For example, when displacement exists in a horizontal direction (direction orthogonal to the longitudinal direction), as illustrated in FIG. 9A and FIG. 9B, the plurality of fluid devices 110A to 110E may meander on the rail member 50 or incline to the left or right side, possibly resulting in a deterioration in sealing performance of the gasket 120.

In this embodiment, the alignment mechanism is provided between the guide part 55 and the engaging part 22 as described above. The alignment mechanism utilizes a portion of the reaction force that resists the bending force produced by the tightening force of the tightening bolts BT on the body 113 and the upstream side and the downstream side joining blocks 20, 20 connected to each other, and acts so as to align the positions of the upstream side and the downstream side joining blocks 20, 20 in the horizontal direction orthogonal to the longitudinal direction of the guide part 55 to a center position of the guide part 55. As a result, the horizontal displacement described above is automatically corrected (automatically moved from an initial position to a regular position) during assembly.

Specifically, as illustrated in FIG. 10, when a lifting force F acts on the joining block 20 due to a bending force, the two receiving surfaces 55f of the guide part 55 apply reaction forces R1, R2 to the two engaging surfaces 22f of the engaging part 22. The guide part 55 and the engaging part 22 are symmetrically formed with respect to the virtual central planes CP, CP2, and thus the reaction forces R1, R2 become the same size. Then, horizontal component forces R1x, R2x of the reaction forces R1, R2 are the same size in directions opposite each other, and thus act so as to cause the virtual central plane CP2 of the engaging part 22 to match the virtual central plane CP of the guide part 55.

Further, vertical component forces R1y, R2y of the reaction forces R1, R2 are the same size and resist the lifting force F, acting so as to constrain the joining block 20 on the rail member 50 (so as to make the rail member function as a support member and support the joining block 20 at the regular position in a fixed manner).

Thus, according to this embodiment, as long as the joining block 20 is inserted into the guide part 55 of the rail member 50 and the body 113 of the fluid device and the joining block 20 are connected by the tightening bolt BT, the joining block 20 is automatically aligned in the center position of the guide part 55, making the assembly work significantly easier and assembly automation easier as well.

While the engaging surfaces 22f of the engaging part 22 and the receiving surfaces 55f of the guide part 55 are formed by inclined surfaces only in the embodiment described above, an engaging part 22_1 and a guide part 55_1 may be configured by an inclined surface and a vertical surface, as illustrated in FIG. 11A. Further, as illustrated in FIG. 11B and FIG. 11C, a curved surface may be used in engaging parts 22_2, 22_3 and guide parts 55_2, 55_3. Furthermore, as illustrated in FIGS. 12A, 12B, engaging parts 22_4, 22_5 may have recessed shapes, and guide parts 55_4, 55_5 may have protruding shapes.

While a case where the joining block 20 and the body 113 are connected by one tightening bolt BT has been described in the embodiment described above, as long as a screw hole exists on the horizontal flow path 23c side with respect to the flow path port 24a, a plurality of tightening bolts BT may be used.

Although not used in the embodiment described above, a positioning pin may also be used between the joining block 20 and the body 113.

While the horizontal flow path 23c is biased toward the bottom surface 20b of the joining block 20 in the embodiment described above, the positioning is not limited thereto and may be formed in the central portion.

While the rail member 50 on which one guide part 55 is formed as the support member is used in the embodiment described above, the support member is not limited thereto, and a plurality of the guide parts 55 may be formed on a single plate as the support member. In this case, the configuration may be one in which the base plate 10 is not used.

While the two flow path ports 24a, 24b are formed in the joining block 20 and the two screw holes 25a, 25b are formed between these in the embodiment described above, the present invention is not limited thereto. The present invention may be applied even when there are three flow path ports, and may be applied even when one flow path port 24a opens to the top surface 20a of the joining block 20 and the other flow path port opens to the side surface 21b of the joining block 20.

While an example has been given of a vertical flow path and a horizontal flow path as the first flow path and the second flow path of the present invention in the embodiment described above, the first and the second flow paths are not limited thereto, and may be inclined with respect to the vertical direction or the horizontal direction. Also, a flat panel display manufacturing method that uses the fluid control system for controlling a fluid used in a flat panel display manufacturing process may be provided. Additionally, a solar panel manufacturing method that uses the fluid control system as for controlling a fluid used in a solar panel manufacturing process mad be provided.

DESCRIPTIONS OF REFERENCE NUMERALS

1 Fluid control system
10 Base plate
20A to 20E Joining block
20a Top surface
20b Bottom surface
21a to 21d Side surface
22 Engaging part
22b Bottom surface
22f Engaging surface (Alignment mechanism)
23 Fluid flow path
23a, 23b Vertical flow path
23c Horizontal flow path
24a, 24b Flow path port
25a, 25b Screw hole
26 Holding recessed part
30 Joining block
50 Rail member
55 Guide part
55f Receiving surface (Alignment mechanism)
110A Switch valve (Two-way valve) (Fluid device)
110B Regulator (Fluid device)
110C Pressure gauge (Fluid device)
110D Switch valve (Three-way valve) (Fluid device)
110E Mass flow controller (Fluid device)
111 Actuator incorporating part
112 Valve incorporating part
113 Body
113a Top surface
113b Bottom surface
114 Through hole
300 Joining member
310 Introducing tube
320 Communicating tube
330 Communicating tube
340 Supply tube
400 Stopper
BT Tightening bolt
BT2 Tightening bolt
GP, GP1, GP2, GP3 Gap

What is claimed is:
1. A fluid control system comprising:
a joining block defining a top surface and a bottom surface facing each other, and side surfaces extending from the top surface toward the bottom surface, defining a fluid flow path, and comprising an engaging part on the bottom surface;

a support member comprising a guide part that extends linearly in a longitudinal direction and is engageable with the engaging part of the joining block; and a fluid device supported by the support member via the joining block, wherein:

the fluid flow path of the joining block comprises two first flow paths extending from the top surface toward the bottom surface and each of the two first flow paths is provided with a flow path port that opens at the top surface, and a second flow path extending through an interior of the joining block in the longitudinal direction and connected with the two first flow paths;

the guide part constrains the joining block on the support member while allowing the joining block to move in the longitudinal direction;

the fluid device comprises a body defining a fluid flow path and provided with at least two flow path ports that open on a bottom surface thereof;

the joining block comprises a screw hole that opens at the top surface, extends toward the bottom surface, and is for screwing a tightening bolt that has passed through the body;

the tightening bolt produces a tightening force that presses a sealing member between the body and the joining block, the sealing member being disposed around the flow path port of the joining block and one of the flow path ports of the body that face each other; and the screw hole comprises a closed-end portion closed above the second flow path, and at least partially overlaps the second flow path in a planar view, wherein each of the two first flow paths connected to the second flow path are formed in positions separated from each other in the longitudinal direction; and the screw hole is positioned between the two flow path ports of the two first flow paths that open at the top surface, in the longitudinal direction.

2. The fluid control system according to claim 1, wherein the second flow path is formed in a position biased toward the bottom surface between the top surface and the bottom surface of the joining block.

3. The fluid control system according to claim 1, wherein each of the two first flow paths is formed vertically with respect to the top surface of the joining block.

4. The fluid control system according to claim 1, wherein:
the joining block comprises four side surfaces orthogonal to the top surface, two of the four side surfaces that are adjacent to each other being mutually orthogonal; and
the second flow path comprises a hole formed on one of two of the four side surfaces that face each other in the longitudinal direction, and comprising an opening that is closed by a closing member.

5. The fluid control system according to claim 4, wherein the support member comprises a single said guide part, and has a width dimension in a direction orthogonal to the longitudinal direction that matches a width of the joining block in a direction orthogonal to the longitudinal direction.

6. The fluid control system according to claim 1, wherein the joining block is connected to the body by a single said tightening bolt.

7. The fluid control system according to claim 1, wherein:
the joining block further comprises another screw hole for connecting a body of another fluid device; said another screw hole is positioned between the two flow path ports of the two first flow paths that open at the top surface.

8. A semiconductor manufacturing method that uses the fluid control system as defined in claim 1 for controlling a fluid used in a semiconductor manufacturing process.

9. A flat panel display manufacturing method that uses the fluid control system as defined in claim 1 for controlling a fluid used in a flat panel display manufacturing process.

10. A solar panel manufacturing method that uses the fluid control system as defined in claim 1 for controlling a fluid used in a solar panel manufacturing process.

11. A joining block defining a top surface and a bottom surface facing each other, and side surfaces extending from the top surface toward the bottom surface, and defining a fluid flow path, the joining block comprising:

an engaging part engageable with another member on the bottom surface; and two screw holes, each connectable with another member and formed from the top surface toward the bottom surface, wherein:

the fluid flow path of the joining block comprises two first flow paths, each extending from the top surface toward the bottom surface and provided with a flow path port that opens at the top surface, and a second flow path extending linearly through an interior of the joining block in the longitudinal direction and connected with the two first flow paths, in positions separated from each other in a longitudinal direction; and the two screw holes are disposed between the two flow path ports in the longitudinal direction, the screw holes each comprising a closed-end portion closed above the second flow path and each at least partially overlapping the second flow path in a planar view.

12. A fluid device comprising at least one of a switch valve, a regulator, a pressure gauge, and a mass flow controller, the fluid device comprising:

a body defining a fluid flow path and provided with at least two flow path ports that open on a bottom surface thereof; and a joining block defining a top surface and a bottom surface facing each other, and side surfaces extending from the top surface toward the bottom surface, and defining a fluid flow path, wherein:

the fluid flow path of the joining block comprises two first flow paths extending from the top surface toward the bottom surface and each of the two first flow paths is provided with a flow path port that opens at the top surface, and a second flow path extending through an interior of the joining block in the longitudinal direction and connected with the two first flow paths;

the joining block comprises an engaging part engageable with another member on the bottom surface, and a screw hole that opens on the top surface, extends toward the bottom surface, and is for screwing a tightening bolt that has passed through the body;

the tightening bolt produces a tightening force that compresses a sealing member between the body and the joining block, the sealing member being disposed around the flow path port of the joining block and one of the flow path ports of the body that face each other; and the screw hole comprises a closed-end portion closed above the second flow path, and at least partially overlaps the second flow path in a planar view, wherein each of the two first flow paths connected to the second flow path are formed in positions separated from each other in the longitudinal direction; and the screw hole is positioned between the two flow path ports of the two first flow paths that open at the top surface, in the longitudinal direction.

13. A fluid control system comprising:
a first joining block and a second joining block, each defining a top surface and a bottom surface facing each other, and side surfaces extending from the top surface toward the bottom surface, defining a fluid flow path, and comprising an engaging part on the bottom surface;
a support member comprising a guide part that extends linearly in a longitudinal direction and is engageable with each of the engaging parts of the first and the second joining blocks; and
a fluid device supported by the support member via the first and the second joining blocks, wherein:
the fluid flow path of the joining block comprises two first flow paths extending from the top surface toward the bottom surface and each of the two first flow paths is provided with a flow path port that opens at the top surface, and a second flow path extending through an interior of the joining block in the longitudinal direction and connected with the two first flow paths;
the guide part constrains the joining block on the support member while allowing the joining block to move in the longitudinal direction;
the fluid device comprises a body defining a fluid flow path and provided with at least two flow path ports that open on a bottom surface thereof;
the first joining block comprises a screw hole that opens at the top surface, extends toward the bottom surface, and is for screwing a tightening bolt that has passed through the body of the fluid device;
the second joining block comprises a screw hole that opens at the top surface, extends toward the bottom surface, and is for screwing a tightening bolt that has passed through the body of the fluid device;
two said tightening bolts that have passed through the body of the fluid device produce tightening forces that press respective sealing members between the body and the first and the second joining blocks, the sealing members being disposed around the flow path port of the first joining block and one of the flow path ports of the body, that face each other, and around the flow path port of the second joining block and the other flow path port of the body, that face each other; and
the screw holes of the first and the second joining blocks each comprise a closed-end portion closed above the second flow path of the first or second joining block and at least partially overlap the second flow path of the first or second joining block in a planar view, wherein
each of the two first flow paths connected to the second flow path are formed in positions separated from each other in the longitudinal direction; and
the screw hole is positioned between the two flow path ports of the two first flow paths that open at the top surface, in the longitudinal direction.

* * * * *